United States Patent
Qin et al.

(10) Patent No.: US 11,004,970 B2
(45) Date of Patent: May 11, 2021

(54) MIRROR DEVICE STRUCTURE FOR POWER MOSFET AND METHOD OF MANUFACTURE

(71) Applicant: NXP USA, Inc., Austin, TX (US)

(72) Inventors: Ganming Qin, Chandler, AZ (US); Feng Li, Austin, TX (US); Vishnu Khemka, Chandler, AZ (US); Moaniss Zitouni, Gilbert, AZ (US); Tanuj Saxena, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/417,243

(22) Filed: May 20, 2019

(65) Prior Publication Data

US 2020/0373426 A1    Nov. 26, 2020

(51) Int. Cl.
| | |
|---|---|
| *H01L 29/78* | (2006.01) |
| *H01L 21/8234* | (2006.01) |
| *H01L 27/088* | (2006.01) |
| *H01L 29/10* | (2006.01) |
| *H01L 29/66* | (2006.01) |

(52) U.S. Cl.
CPC .. *H01L 29/7815* (2013.01); *H01L 21/823487* (2013.01); *H01L 27/088* (2013.01); *H01L 29/1095* (2013.01); *H01L 29/66734* (2013.01); *H01L 29/7813* (2013.01)

(58) Field of Classification Search
CPC .................. H01L 29/78; H01L 29/7815; H01L 29/66734; H01L 29/1095
See application file for complete search history.

(56) References Cited

U.S. PATENT DOCUMENTS

| | | | | |
|---|---|---|---|---|
| 5,323,028 | A | * | 6/1994 | Nishizawa .......... H01L 29/7392 257/136 |
| 2014/0070313 | A1 | | 3/2014 | Wang et al. |
| 2017/0179108 | A1 | | 6/2017 | Okuda et al. |
| 2018/0047721 | A1 | | 2/2018 | Nishimura |
| 2019/0341483 | A1 | | 11/2019 | Harada et al. |

FOREIGN PATENT DOCUMENTS

| | | |
|---|---|---|
| EP | 0962987 A2 | 12/1999 |
| EP | 0962987 A3 | 12/1999 |
| EP | 1959499 A2 | 8/2008 |
| EP | 1959499 A3 | 8/2008 |
| WO | WO-2018/150713 A1 | 8/2018 |

* cited by examiner

Primary Examiner — Trang Q Tran
(74) Attorney, Agent, or Firm — Charlene R. Jacobsen

(57) ABSTRACT

A MOSFET includes a substrate having a body region of a first conductivity type. A main field effect transistor (mainFET) and a mirror device are formed in the substrate. The mainFET includes first gate trenches, first source regions of a second conductivity type adjacent to the first gate trenches, and first body implant regions of the first conductivity type extending into the body region adjacent to and interposed between the first source regions. The mirror device includes second gate trenches, second source regions of the second conductivity type adjacent to the second gate trenches, second body implant regions of the first conductivity type extending into the body region adjacent to and interposed between the second source regions, and link elements of the first conductivity type interconnecting pairs of the second body implant regions.

15 Claims, 7 Drawing Sheets

MIRROR DEVICE STRUCTURE FOR POWER MOSFET AND METHOD OF MANUFACTURE

TECHNICAL FIELD OF THE INVENTION

The present invention relates generally to semiconductor devices and methods. More specifically, the present invention relates to metal-oxide-semiconductor field effect transistors (MOSFETs) that incorporate current sensing mirror devices.

BACKGROUND OF THE INVENTION

Metal-oxide-semiconductor field effect transistors (MOSFETs) are commonly used in modern electronics as individual devices and as part of various integrated circuits (ICs). Particularly demanding applications of MOSFETs occur where they are intended to control large amounts of power, e.g., heavy currents. A type of MOSFET that may be used for this type of application is a power MOSFET. In some examples, power MOSFETS may have relatively low on-resistances, fast switching speeds, high withstand voltage capability, a control electrode isolated from current conducting silicon thereby removing the need for a continuous "on" current, and so forth.

Typically, a current sensing device, also referred to a "mirror device," is used within a power MOSFET to provide a measurement of the amount of current being conducted by the power MOSFET. The output of the mirror device is used to monitor the current being conducted by the power MOSFET so that the power MOSFET is protected from damage due to over-current conditions. Comparatively small MOSFETs may be used as current sensing mirror devices for power MOSFETs. In general, the mirror device and the power MOSFET may share common gate and drain terminals, but have independent source terminals. In this way, the current flowing through the source terminal of the mirror device can provide a measure of the current flowing through the source terminal of the power MOSFET.

SUMMARY

Aspects of the disclosure are defined in the accompanying claims.

In a first aspect, there is provided a metal-oxide-semiconductor field effect transistor (MOSFET) comprising a substrate having upper and lower surfaces, the substrate including a body region of a first conductivity type. A main field effect transistor (mainFET) is formed in the substrate, the mainFET including first gate trenches extending into the body region from the upper surface, first source regions of a second conductivity type adjacent to the first gate trenches, the second conductivity type differing from the first conductivity type, and first body implant regions of the first conductivity type extending into the body region adjacent to and interposed between the first source regions, wherein a doping concentration of the first body implant regions exceeds a background doping concentration of the body region. A mirror device is formed in the substrate, the mirror device including one or more second gate trenches extending into the body region from the upper surface, second source regions of the second conductivity type adjacent to the second gate trenches, second body implant regions of the first conductivity type extending into the body region adjacent to and interposed between the second source regions, wherein the doping concentration of the second body implant regions exceeds the background doping concentration of the body region, and link elements of the first conductivity type interconnecting pairs of the second body implant regions.

In a second aspect, there is provided a method for forming a metal-oxide-semiconductor field effect transistor (MOSFET) having an embedded mirror device comprising providing a substrate having upper and lower surfaces, the substrate including a body region of a first conductivity type, forming a main field effect transistor (mainFET) in the substrate, the mainFET including first gate trenches extending into the body region from the upper surface, first source regions of a second conductivity type adjacent to the first gate trenches, the second conductivity type differing from the first conductivity type, and first body implant regions of the first conductivity type extending into the body region adjacent to and interposed between the first source regions, wherein a doping concentration of the first body implant regions exceeds a background doping concentration of the body region, and forming a mirror device in the substrate, the mirror device including one or more second gate trenches extending into the body region from the upper surface, second source regions of the second conductivity type adjacent to the second gate trenches, second body implant regions of the first conductivity type extending into the body region adjacent to and interposed between the second source regions, wherein the doping concentration of the second body implant regions exceeds the background doping concentration of the body region and link elements of the first conductivity type interconnecting pairs of the second body implant regions In a third aspect, there is provided a metal-oxide-semiconductor field effect transistor (MOSFET) comprising a substrate having upper and lower surfaces, the substrate including a body region of a first conductivity type. A main field effect transistor (mainFET) is formed in the substrate, the mainFET including first gate trenches extending into the body region from the upper surface, first source regions of a second conductivity type adjacent to the first gate trenches, the second conductivity type differing from the first conductivity type, and first body implant regions of the first conductivity type extending into the body region adjacent to and interposed between the first source regions, wherein a doping concentration of the first body implant regions exceeds a background doping concentration of the body region. A mirror device formed in the substrate, the mirror device including one or more second gate trenches extending into the body region from the upper surface, second source regions of the second conductivity type adjacent to the second gate trenches, second body implant regions of the first conductivity type extending into the body region adjacent to and interposed between the second source regions, wherein the doping concentration of the second body implant regions exceeds the background doping concentration of the body region, and link elements of the first conductivity type interconnecting pairs of the second body implant regions, the link elements have the same doping concentration as the second body implant regions, wherein the mainFET does not include the link elements interconnecting pairs of the first body implant regions.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a power metal-oxide-semiconductor field effect transistor (MOSFET) having a current sensing mirror device and methodology for manufacturing a power MOSFET having an embedded current sensing mirror device. More particularly, a power MOSFET includes a mainFET and a current sensing FET, referred to herein as a mirror device. The mirror device implements an optimized layout that may effectively result in the threshold voltage of the mirror device more closely matching the threshold voltage of the mainFET in order to reduce or eliminate yield loss from fault current detection at the mirror device. An optimized layout for the mirror device can include link elements interconnecting pairs of the body implant regions. In some embodiments, the optimized layout may further entail widening the body implant regions so that the body implant regions are closer to the trench MOSFET channels. The optimized layout for the mirror device may be implemented in a power MOSFET without full mask revision to cost effectively achieve improvements in manufacturing yield.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

Although the abbreviation "MOS" and "MOSFET" and the terms for which they stand, literally refer to a FET having a metal gate electrode and an oxide gate insulator, the abbreviations MOS and MOSFET and the terms for which they stand are used throughout to refer to any semiconductor device that includes a conductive gate (whether metal or not) that is positioned over a gate insulator (whether oxide or other dielectric) which, in turn, is positioned over a semiconductor substrate. Accordingly, the term metal-oxide-semiconductor and the abbreviations "MOS" and "MOSFET" are used herein even though such devices may not employ just metals or oxides but conductive materials other than metals, and insulating materials other than oxides. Non-limiting examples of conductive materials suitable for use in MOS and MOSFETs are metals, metal alloys, semi-metals, metal-semiconductor alloys or compounds, doped semiconductors, combinations thereof. Non-limiting examples of insulating materials suitable for use in MOS and MOSFETs are oxides, nitrides, oxy-nitrides mixtures, organic insulating materials and other dielectrics.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

It should be understood that the use of relational terms, if any, such as first and second, top and bottom, and the like are used solely to distinguish one from another entity or action without necessarily requiring or implying any actual such relationship or order between such entities or actions. It is to be understood that the terms so used are interchangeable under appropriate circumstances such that the embodiments described herein are, for example, capable of operation or arrangement in sequences other than those illustrated or otherwise described herein.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures, bulk or semiconductor-on-insulator (SOI) structures.

For convenience of explanation and not intended to be limiting, semiconductor devices and methods of fabrication are described herein for silicon semiconductors, but persons of skill in the art will understand that other semiconductor materials may also be used. Additionally, various device types and/or doped semiconductor regions may be identified as being of N type or P type, but this is merely for convenience of description and not intended to be limiting, and such identification may be replaced by the more general description of being of a "first conductivity type" or a "second, opposite conductivity type", where the first conductivity type may be either N or P type and the second conductivity type is then either P or N type. Various embodiments of the invention will be illustrated for N-channel MOSFETs but, again, this is merely for convenience of description and is not intended to be limiting. Persons of skill in the art will understand that P-channel MOSFETs and other semiconductor devices and circuits embodying either or both N-channel and P-channel combinations may be provided by appropriate interchange of conductivity types in the various regions.

Figure 1:
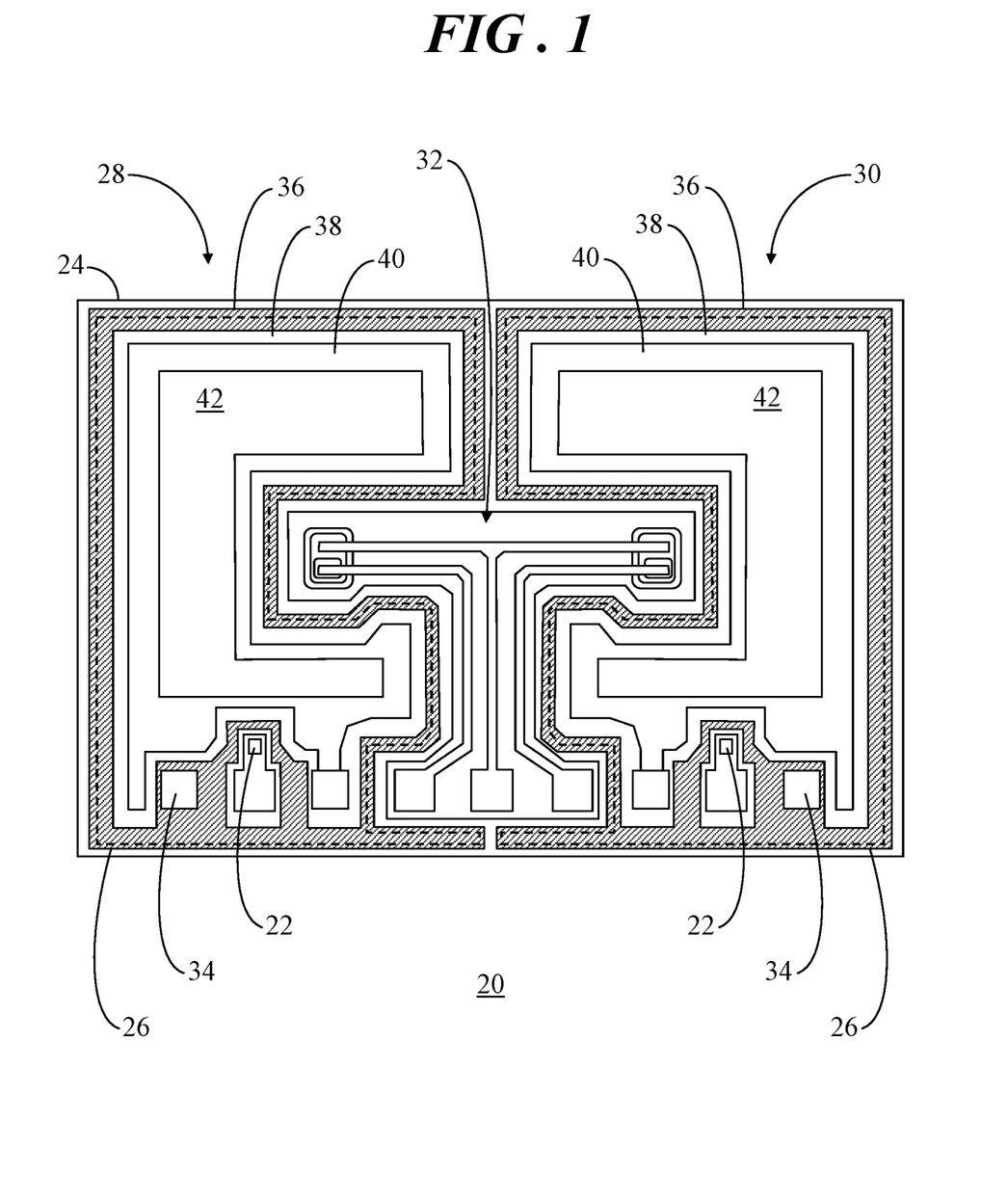
FIG. 1 shows a simplified plan view of a power MOSFET incorporating a current sensing mirror device.

FIG. 1 shows a simplified plan view of a MOSFET, referred to herein as a power MOSFET 20, incorporating a current sensing mirror device 22. In particular, power MOSFET 20 includes a common substrate 24 incorporating a FET 26 and an embedded current sensing mirror device 22. For convenience, the main part of the power MOSFET (not including current sensing mirror device 22) will be referred to herein as a "mainFET 26" and current sensing mirror device 22 may simply be referred to herein as mirror device 22. In this example, power MOSFET 20 may be a dual device power die that includes a first power device 28, a second power device 30, and a temperature sense device 32. First and second power devices 28 may be essentially identical. Thus, each of first and second power devices 28, 30 includes mainFET 26 and mirror device 22 suitably isolated from its associated mainFET 26.

The following features are common to both of first and second power devices 28, 30. A gate contact pad 34 is coupled to peripheral gate metal 36, which is used for distributing a gate signal to the various common gate regions within power MOSFET 20. A gap 38 may be provided between peripheral gate metal 36 and source metal 40 of mainFET 26. Mirror device 22 additionally includes source metal (not distinguishable in FIG. 1). The source regions of mainFET 26 generally underlie its corresponding source metal 40 and the source regions of mirror device 22 generally underlie its corresponding source metal. A passivation region 42 may overlie at least part of source metal 40. The gates (not visible) of power MOSFET 20 may run perpendicular to the page, and thus extend inwardly into the page. As will be discussed in greater detail below, the gates are generally in the form of multiple dielectric lined, conductor filled trenches. The source regions lie alongside such dielectric lined trenches.

Further additional features of power MOSFET 20 generally illustrated in FIG. 1 (e.g., temperature sense device 32, contact pads, Kelvin-sense connections, and so forth) are not described herein for brevity. Additionally, the dual device power die is provided for illustrative purposes to demonstrate a power MOSFET with one or more embedded current sensing mirror devices. It should be understood that a wide variety of power die layouts may be envisioned.

An important parameter of a power MOSFET is the current sense ratio (CSR). A current sensing mirror device typically passes only a small fraction of the total load current in proportion to the ratio of the areas of the mirror device and the mainFET. Hence, the CSR is the ratio between the current flowing through the mainFET to the current flowing through the current sensing mirror device when subjected to substantially the same terminal voltages. As mentioned above, the CSR is a property of the device geometry, as for example, the ratio of the active area of the two devices, the ratio being defined when the devices are designed. However, the CSR may be affected by more than just device geometry. For example, a difference between the threshold voltage of the mirror device and the threshold voltage of the mainFET (e.g., $\Delta V_{th}$) can have a strong impact on the accuracy of the CSR over the turn off transit period when the gate to source voltage ($V_{GS}$) changes from high voltage to low voltage.

The threshold voltage, commonly abbreviated as $V_{th}$ of a field-effect transistor is the minimum gate-to-source voltage $V_{GS(th)}$ that is needed to create a current conducting path between the source and drain terminal. The following simplified analytical model demonstrates the impact of $\Delta V_{th}$ on the CSR in the linear region:

$$CSR = f(V_{GS}) \quad (1)$$

$$I_{DS} = K * (V_{GS} - V_{th} - 0.5 * V_{DS}) * V_{DS} \quad (2)$$

$$CSR = \frac{I_{DS\text{-}mainFET}}{I_{DS\text{-}mirror}} = CSR_0 * \frac{(V_{GS} - V_{th\text{-}mainFET})}{(V_{GS} - V_{th\text{-}mirror})} \quad (3)$$

In the above equations, "K" is a technology related constant associated with the transistor, "$V_{GS}$" is the gate-source voltage, "$V_{th}$" is the threshold voltage, "$V_{DS}$" is the drain-source voltage, and "$I_{DS}$" is the load current. Thus, "$I_{DS\text{-}mainFET}$" is the load current at the mainFET, "$I_{DS\text{-}mirror}$" is the load current at the mirror device, "$V_{th\text{-}mainFET}$" is the threshold voltage of the mainFET, and "$V_{th\text{-}mirror}$" is the threshold voltage of the mirror device. It can be observed in equation (3) that variations of the threshold voltage ($V_{th\text{-}mirror}$) of the mirror device relative to the threshold voltage ($V_{th\text{-}mainFET}$) of the mainFET can result in inaccuracy of the CSR. Further, it has been observed this inaccuracy may be exacerbated over the turn off transit period when the gate to source voltage ($V_{GS}$) changes from high voltage (e.g., normal operating voltage) to low voltage. The discrepancy between the CSR at normal operating voltage versus the CSR at low voltage due to the threshold voltage ($V_{th\text{-}mirror}$) of the mirror device being slightly different from the threshold voltage ($V_{th\text{-}mainFET}$) of the mainFET may be due at least in part to process variation and loading effect.

A power MOSFET is typically provided with an over-current protection feature that causes the high side MOSFET to turn off (despite the on-command of the gate voltage) when the load current reaches some predefined maximum current. For example, the mirror device copies or mirrors the load current flowing through the mainFET and in many cases, the output of the mirror device can be used to monitor the load current being conducted by the mainFET so that the mainFET is protected from damage due to over-current conditions. The inaccuracy of the CSR resulting from the differing threshold voltages between the mirror device and the mainFET can result in a fault detection of over-current which will shut down the mainFET even though the operational current of the mainFET is normal, thereby adversely affecting yield.

A conventional mirror device is constructed such that it has the same channel dimensions as its corresponding mainFETs, and the mirror device and mainFET have equal gate-source voltages. Current ratioing (e.g., defining the CSR) is achieved by scaling the width of mirror device (e.g., the number of channels) relative to the mainFET. In accordance with embodiments described herein, the mirror device implements an optimized layout that may effectively result in the threshold voltage of the mirror device more closely matching the threshold voltage of the mainFET in order to reduce or eliminate yield loss from fault current detection at the mirror device. An optimized layout for the mirror device can include link elements interconnecting pairs of body implant regions and widening the body implant regions (relative to those in the mainFET) so that the body implant regions are closer to the trench MOSFET channels of the mirror device.

Figure 2:
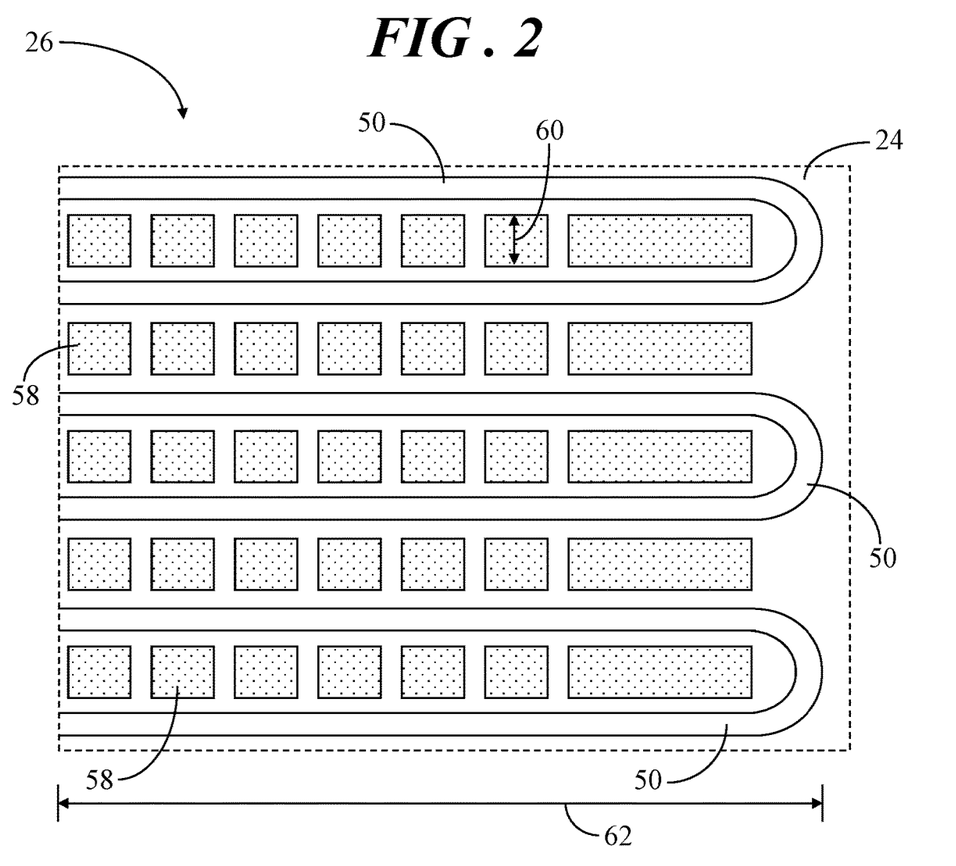
FIG. 2 shows an enlarged simplified plan view of a portion of a mainFET of the power MOSFET of FIG. 1.
Figure 3:
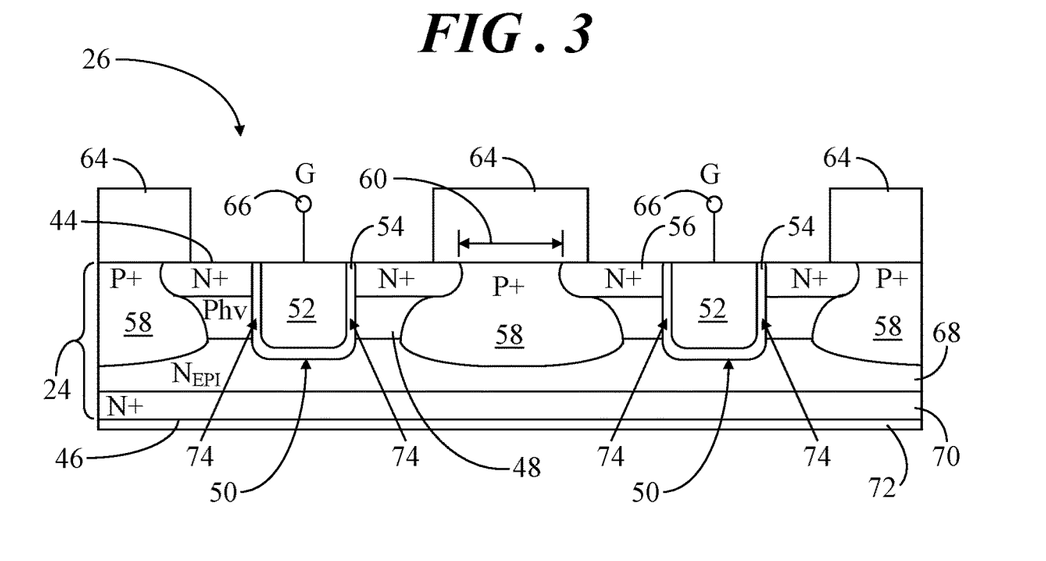
FIG. 3 shows a simplified cross-sectional view of the mainFET of FIG. 2.

Referring concurrently to FIGS. 2-3, FIG. 2 shows an enlarged simplified plan view of a portion of mainFET 26 formed in substrate 24 of power MOSFET 20 (FIG. 1) and FIG. 3 shows a simplified cross-sectional view of mainFET 26. Substrate 24 has upper and lower surfaces 44, 46 and includes a body region 48 of a first conductivity type (e.g., P type). Body region 48 may be a high voltage P-region (e.g., Phv), which may reduce the susceptibility of drain-to-source punch-through as well as yield a predetermined threshold voltage ($V_{th\text{-}mainFET}$) for mainFET 26.

MainFET 26 includes first gate trenches 50 extending into body region 48 from upper surface 44 of substrate 24. First gate trenches 50 are in a U-shaped configuration in this example. First gate trenches 50 include conductive gate cores 52 laterally enclosed by dielectric liners 54. First source regions 56 (best seen in FIG. 3) of a highly doped second conductivity type (e.g., N+ type) are adjacent to first gate trenches 50. Thus, first source regions 56 lie laterally outside of dielectric liners 54 proximate upper surface 44 of substrate 24 in body region 48.

For simplicity in the following description, the first conductivity type is P type and the second conductivity type is N type. However, in other embodiments, the first conductivity type may by N type such that the second conductivity type would be P type. Additionally, a lightly doped material will be denoted by "−" following either P or N and a heavily doped material will be denoted by "+" following either P or N, and a background or baseline doping concentration with be denoted by the absence of either "−" or "+" following P or N. Thus, a P− type or N− type region has a lower doping concentration than the doping concentration of a P type or N type region and a P+ type or N+ type region has a higher doping concentration than the doping concentration of a P type or N type region.

MainFET 26 further includes first body implant regions 58 of the first conductivity type (e.g., P+ type) extending into body region 48 adjacent to and interposed between first source regions 56. Thus, first body implant regions 58 lie laterally beside first source regions 56 proximate upper surface 44 of substrate 24. A doping concentration of first body implant regions 58 exceeds a background doping concentration of body region 48 as denoted by "P+." First body implant regions 58 may increase the integrity of the source to substrate connection as well as reduce the susceptibility of mainFET 26 to parasitic bipolar effects.

Figure 4:
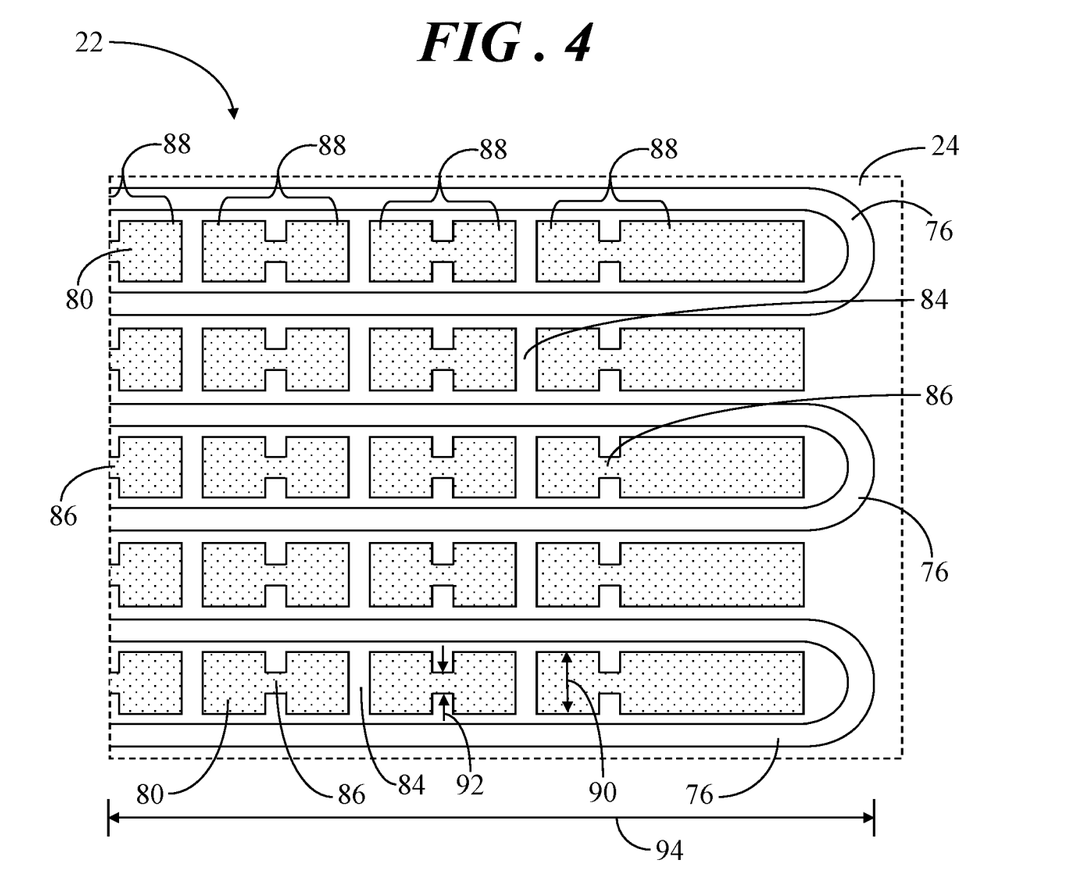
FIG. 4 shows an enlarged simplified plan view of a portion of the current sensing mirror device of the power MOSFET of FIG. 1 in accordance with an embodiment.
Figure 5:
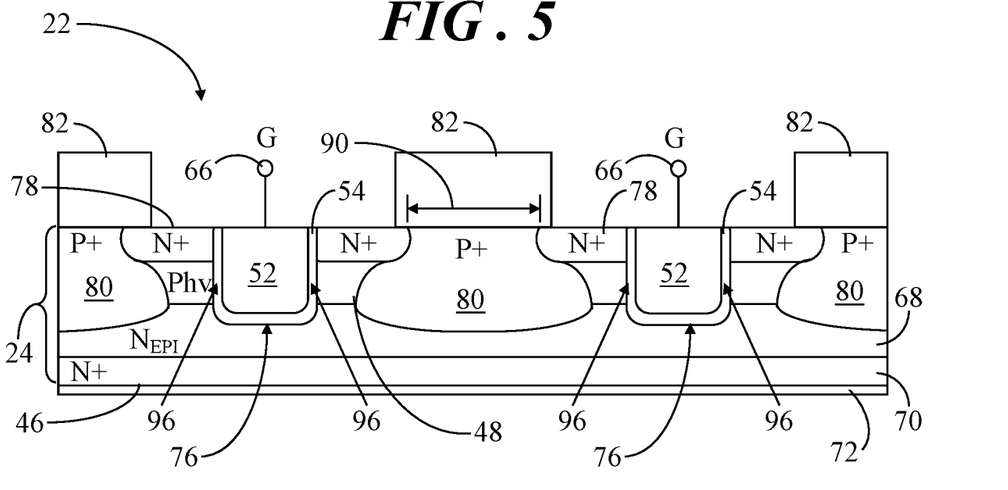
FIG. 5 shows a simplified cross-sectional view of the current sensing mirror device of FIG. 4.

Each of first body implant regions 58 is characterized by a first implant region width 60 at upper surface 44 of substrate 24, in which first implant region width 60 is oriented perpendicular to a longitudinal dimension 62 of first gate trenches 50. First implant region width 60 will be compared to a second implant region width discussed below in connection FIGS. 4 and 5 showing mirror device 22 (FIG. 1).

First source contacts 64 (sometimes referred to as source metal) at upper surface 44 of substrate 24 are associated with first source regions 56 and first body implant regions 58, and provide electrical contact to first source regions 56 and first body implant regions 58. First source contacts 64 substantially couple some or all of first source regions 56 of mainFET 26 in parallel. First source regions 56 are shorted through first source contacts 64 and first body implant regions 58 to body region 48. Gate contacts 66 are represented schematically at top surface 44 of substrate 24 and provide electrical contact to conductive gate cores 52.

Substrate 24 further includes a lightly doped N-type epitaxial layer 68 (NEPI) and a highly doped N+ drain region 70 underlying epitaxial layer 68. Body regions 48 extend into epitaxial layer 68 to a depth primarily dictated by the target channel length. A drain contact 72 is coupled to lower surface 46 of substrate 24 and is electrically connected to drain region 70. Of course, mainFET 26 may include other material layers and features that are not illustrated herein for simplicity.

The structure of mainFET 26 is referred to as a vertically-conducting trench MOSFET having a vertical channel 74. In general, when mainFET 26 is biased in the on state, current flows vertically between first source regions 56 and drain region 70. The current capability of mainFET 26 in the on state is typically a function of the drain to source resistance.

Referring concurrently to FIGS. 4-5, FIG. 4 shows an enlarged simplified plan view of a portion of current sensing mirror device 22 formed in substrate 24 of power MOSFET 20 (FIG. 1) in accordance with an embodiment and FIG. 5 shows a simplified cross-sectional view of mirror device 22. The configuration of mirror device 22 is similar, but not identical to, the layout of mainFET 26. Hence, mirror device 22 includes one or more second gate trenches 76 extending into body region 48 from upper surface 44 of substrate 24. Like first gate trenches 50, second gate trenches include conductive gate cores 52 laterally enclosed by dielectric liners 54. Second source regions 78 of the highly doped second conductivity type (e.g., N+ type) are adjacent to second gate trenches 76. Thus, second source regions 78 lie laterally outside of dielectric liners 54 proximate upper surface 44 of substrate 24 in body region 48.

Mirror device 22 further includes second body implant regions 80 of the first conductivity type (e.g., P+ type) extending into body region 48 adjacent to and interposed between second source regions 78. Thus, second body implant regions 80 lie laterally beside second source regions 78 proximate upper surface 44 of substrate 24. A doping concentration of second body implant regions 80 exceeds a background doping concentration of body region 48 as denoted by "P+." Again, second body implant regions 80 may increase the integrity of the source to substrate connection as well as reduce the susceptibility of mirror device 22 to parasitic bipolar effects.

Second source contacts 82 at upper surface 44 of substrate 24 are associated with second source regions 78 and second body implant regions 80, and provide electrical contact to second source regions 78 and second body implant regions 80. Second source contacts 82 substantially couple some or all of second source regions 78 of mirror device 22 in parallel. However, second source regions 78 are not coupled to first source regions 56 (FIG. 3) of mainFET 26 (FIG. 30. That is, mainFET 26 (FIG. 3) and mirror device 22 have independent source terminals. Second source regions 78 are shorted through second source contacts 82 and second body implant regions 80 to body region 48 of substrate 24 at mirror device 22.

Gate contacts 66 are again represented schematically at top surface 44 of substrate 24 and provide electrical contact to conductive gate cores 52 of second gate trenches 78. Drain contact 72 is coupled to lower surface 46 of substrate 24 and is electrically connected to drain region 70. As mentioned above, a mainFET and a current sensing mirror device may share common gate and drain terminals. Hence, the same reference numerals representing these features (e.g., gate contacts 66 and drain contact 72) are used in the descriptions of mainFET 26 of FIGS. 2-3 and mirror device 22 of FIGS. 4-5 to denote the shared terminals. Like mainFET 26, mirror device 22 may include other material layers and features that are not illustrated herein for simplicity.

Second body implant regions 80 are spaced apart by gaps 84. In accordance with an embodiment, mirror device 22 further includes link elements 86 of the first conductivity type (e.g., P+ type) spanning gaps 84 and interconnecting selected pairs 88 of second body implant regions 80. Additionally, each of the second body implant regions 80 that forms the interconnected pairs 88 of second body implant regions 80 is not interconnected to an adjacent one of second body implant regions 80 by link elements so that gaps 84 remain between the interconnected pairs 88 of second body implant regions 80. In accordance with some embodiments, link elements 86 have the same doping concentration as second body implant regions 80 and are formed concurrently with second body implant regions 80. Link elements 86 are present in mirror device 22 and are absent in mainFET 26. That is, mainFET 26 does not include link elements interconnecting pairs of first body implant regions 58 (FIGS. 2-3). In the illustrated embodiment, every pair 88 of second body implant regions 80 is interconnected by a distinct one of link elements 86. However, alternative embodiments may have other interconnection configurations (discussed below).

In the illustrated embodiment, each of second body implant regions 80 is characterized by a second implant region width 90 at upper surface 44 of substrate 24 and each of link elements 86 is characterized by a link element width 92 at upper surface 44 of substrate 24. Second implant region width 90 and link element width 92 are oriented perpendicular to a longitudinal dimension 94 of second gate trenches 76, and link element width 92 is less than second implant region width 90. In some embodiments, link element width 92 may be in a range of 40-60% less than implant region width 90.

Additionally, second implant region width 90 of second body implant regions 80 may be greater than first implant region width 60 (FIGS. 2-3) of first body implant regions 58 (FIGS. 2-3) of mainFET 26 so that second body implant regions 80 of mirror device 22 are closer to the trench MOSFET channels 96 relative to the trench MOSFET channels 74 (FIG. 3) of mainFET 26. In some embodiments, second implant region width 90 may be in a range of 10-30% greater than first implant region width 60.

Accordingly, the unit cell layout of mirror device 22 is modified relative to the unit cell layout of mainFET 26, which is in contrast to prior art configurations in which the mirror device and mainFET unit cell layouts are identical. A threshold voltage ($V_{th\text{-}mirror}$) for a mirror device may differ from threshold voltage ($V_{th\text{-}mainFET}$) for a mainFET due to, for example, process loading effects. The presence of link elements 86 alone, or in combination with the wider second body implant regions 80, may modulate (e.g., change) the threshold voltage ($V_{th\text{-}mirror}$) for mirror device 22 to more closely match the threshold voltage ($V_{th\text{-}mainFET}$) for mainFET 26. When the threshold voltage ($V_{th\text{-}mirror}$) for mirror device 22 is approximately equivalent to threshold voltage ($V_{th\text{-}mainFET}$) for mainFET 26, the accuracy of the CSR is less likely to be adversely affected, as demonstrated in equations (1)-(3) above, especially during the turnoff transit period when gate-to-source voltage changes from normal operation to low voltage. Additionally, the optimized layout modifications of mirror device 22 relative to the layout of mainFET 26 may be implemented in a power MOSFET without full mask revision to cost effectively achieve improvements in manufacturing yield.

Figure 6:
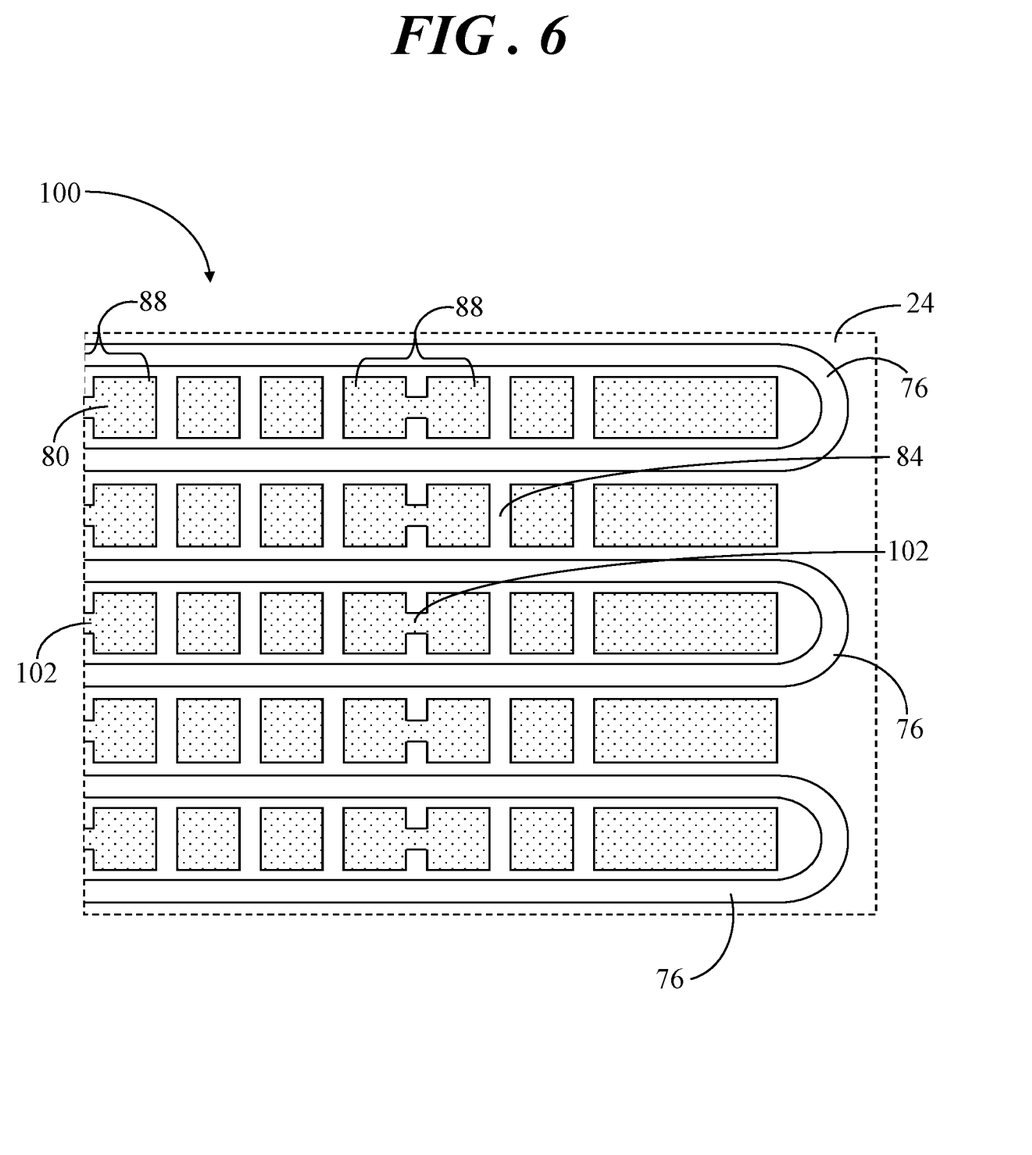
FIG. 6 shows an enlarged simplified plan view of a portion of a current sensing mirror device in accordance with another embodiment.

FIG. 6 shows an enlarged simplified plan view of a portion of a current sensing mirror device 100 in accordance with another embodiment. Mirror device 100 may be implemented in power MOSFET 20 (FIG. 1) in lieu of mirror device 22. Hence, common features of mirror device 22 and mirror device 100 will have the same reference numerals and any features of mirror device 100 that differ from mirror device 22 will have a different reference numeral.

Mirror device 100 includes second gate trenches 76 extending into body region 48 from upper surface 44 of substrate 24. Second source regions 78 of the highly doped second conductivity type (e.g., N+ type) are adjacent to second gate trenches 76, as illustrated in FIG. 5. Mirror device 100 further includes second body implant regions 80 of the first conductivity type (e.g., P+ type) spaced apart by gaps 84, and link elements 102 of the first conductivity type (e.g., P+ type) interconnecting selected pairs 88 of second body implant regions 80. Additionally, each the second body implant regions 80 that forms the interconnected pairs 88 of second body implant regions 80 is not interconnected to an adjacent one of second body implant regions 80 by link elements 102 so that gaps 84 remain between the interconnected pairs 88 of second body implant regions 80.

In the example of FIG. 6, every other pair 88 of second body implant regions 80 is interconnected by a distinct one of link elements 102. Such a configuration may achieve a different threshold voltage, $V_{th\text{-}mirror}$, for mirror device 100 per predetermined design criteria relative to the layout of mirror device 22.

Figure 7:
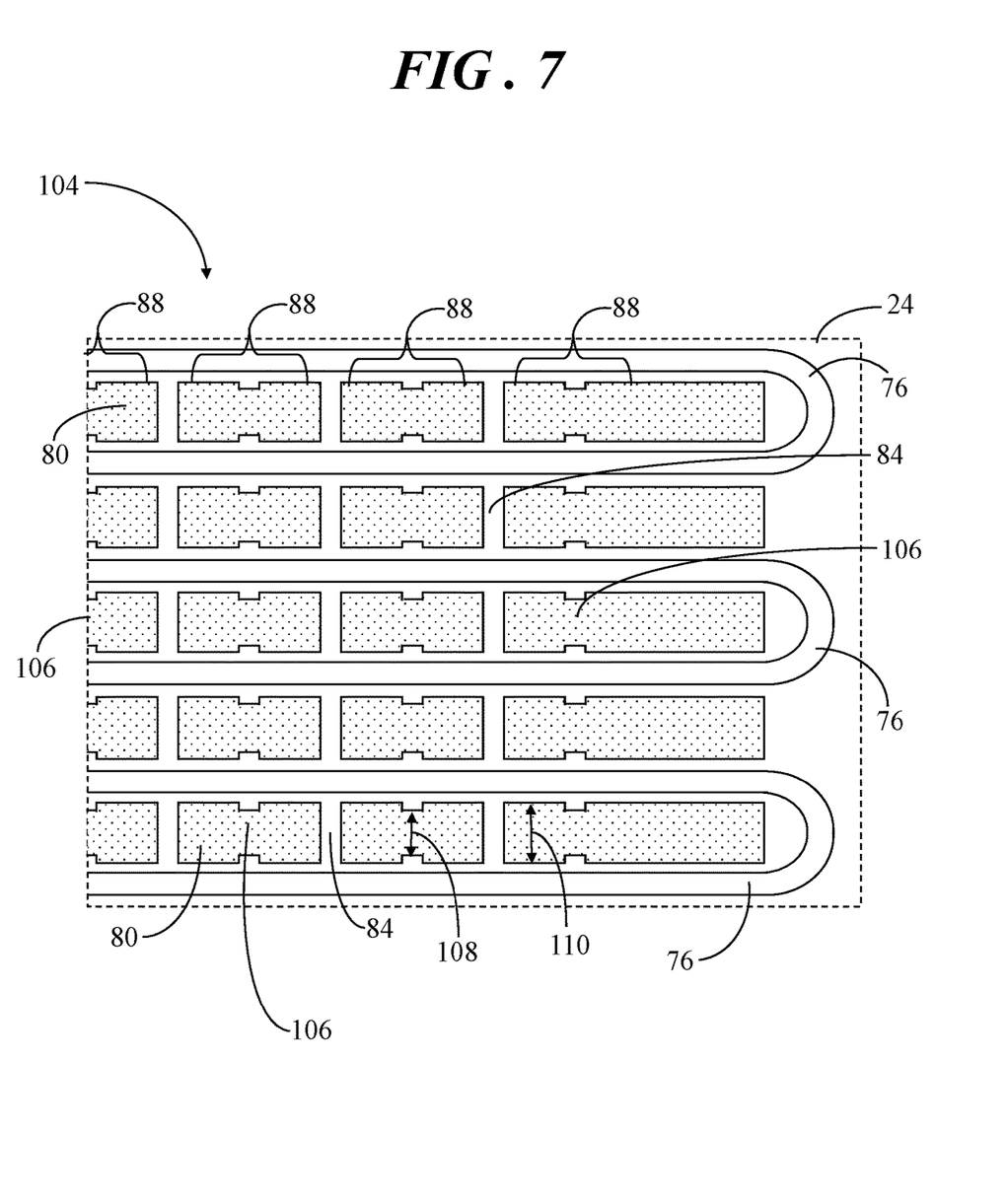
FIG. 7 shows an enlarged simplified plan view of a portion of a current sensing mirror device in accordance with another embodiment.

FIG. 7 shows an enlarged simplified plan view of a portion of a current sensing mirror device 104 in accordance with another embodiment. Mirror device 104 may be implemented in power MOSFET 20 (FIG. 1) in lieu of either of mirror device 22 or mirror device 100 (FIG. 6). Hence, common features of mirror devices 22, 100 and mirror device 104 will have the same reference numerals and any features of mirror device 104 that differ from mirror devices 22, 100 will have a different reference numeral.

Mirror device 104 includes second gate trenches 76 extending into body region 48 from upper surface 44 of substrate 24. Second source regions 78 of the highly doped second conductivity type (e.g., N+ type) are adjacent to second gate trenches 76, as illustrated in FIG. 5. Mirror device 104 further includes second body implant regions 80 of the first conductivity type (e.g., P+ type) spaced apart by gaps 84, and link elements 106 of the first conductivity type (e.g., P+ type) interconnecting selected pairs 88 of second body implant regions 80. Additionally, each the second body implant regions 80 that forms the interconnected pairs 88 of second body implant regions 80 is not interconnected to an adjacent one of second body implant regions 80 by link elements 106 so that gaps 84 remain between the interconnected pairs 88 of second body implant regions 80.

In the example of FIG. 7, every other pair 88 of second body implant regions 80 is interconnected by a distinct one of link elements 106 (like in mirror device 22). However, a link element width 108 of link elements 106 is significantly wider than link element width 92 (FIG. 4) of link elements 86 (FIG. 4). By way of example, link element width 92 may be approximately equivalent to or slightly less than an implant region width 110 of second body implant regions 80. Such a configuration may achieve a different threshold voltage, $V_{th\text{-}mirror}$, per predetermined design criteria relative to the layouts of mirror devices 22 and 100.

Although three layout modifications of the mirror device relative to the layout of mainFET 26 (FIGS. 2-3) are illustrated herein, it should be understood that alternative embodiments may include more than or fewer than the illustrated link elements. The link elements may vary in width from that shown, and the body implant regions may vary from that shown.

Figure 8:
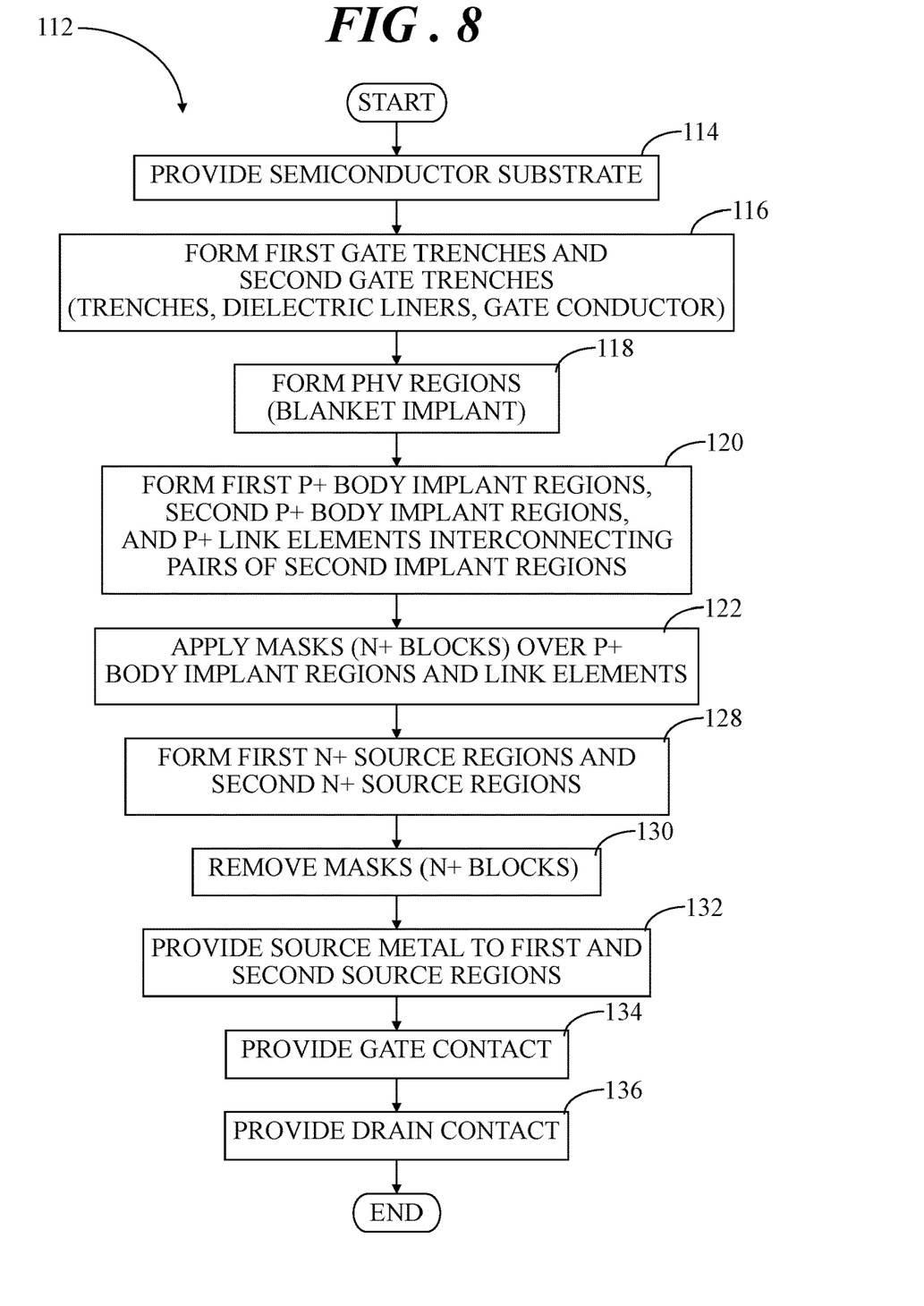
FIG. 8 shows a simplified flowchart of a method for fabricating a power MOSFET incorporating the mainFET and current sensing mirror device in accordance with another embodiment.

FIG. 8 shows a simplified flowchart of a method 112 for fabricating power MOSFET 20 (FIG. 1) incorporating mainFET and current sensing mirror device 22 (FIGS. 4-5), 100 (FIG. 6), 104 (FIG. 7) in accordance with another embodiment. For simplicity, method 112 will be described in connection with the configuration of power MOSFET 20 including the embedded mirror device 22. Thus, reference should be made concurrently with FIGS. 1-5 in connection with the following description of FIG. 8. However, the following description applies equivalently to a power MOSFET including mirror device 100, a power MOSFET including mirror device 104, and a power MOSFET having a different configuration then that shown in FIG. 1 that includes a current sensing mirror device such as those described herein.

At a block 114, a substrate (24) is provided having upper (44) and lower (46) surfaces, including therein a body region (48). At a block 116, first gate trenches (50) for a mainFET (26) and second gate trenches (76) for a mirror device (22) are formed extending into the body region (48) from the upper surface (44) of the substrate (24). Block 116 may entail forming trenches in the body region (48), providing dielectric liners (54) in the trenches, and forming the conductive gate cores (52) in the first and second gate trenches (50, 76). At a block 118, a blanket implant process may be performed to provide Phv in the body region (48).

At a block 120, first body implant regions (58), second body implant regions (80), and link elements (86) interconnecting selected pairs (88) of the second body implant regions (80), all of P+ type, are formed extending into the body region (48) from the upper surface (44). At a block 122, mask structures, referred to herein as N+ blocks, are applied over the body implant regions (58, 80) and over the link elements (86).

Figure 9:
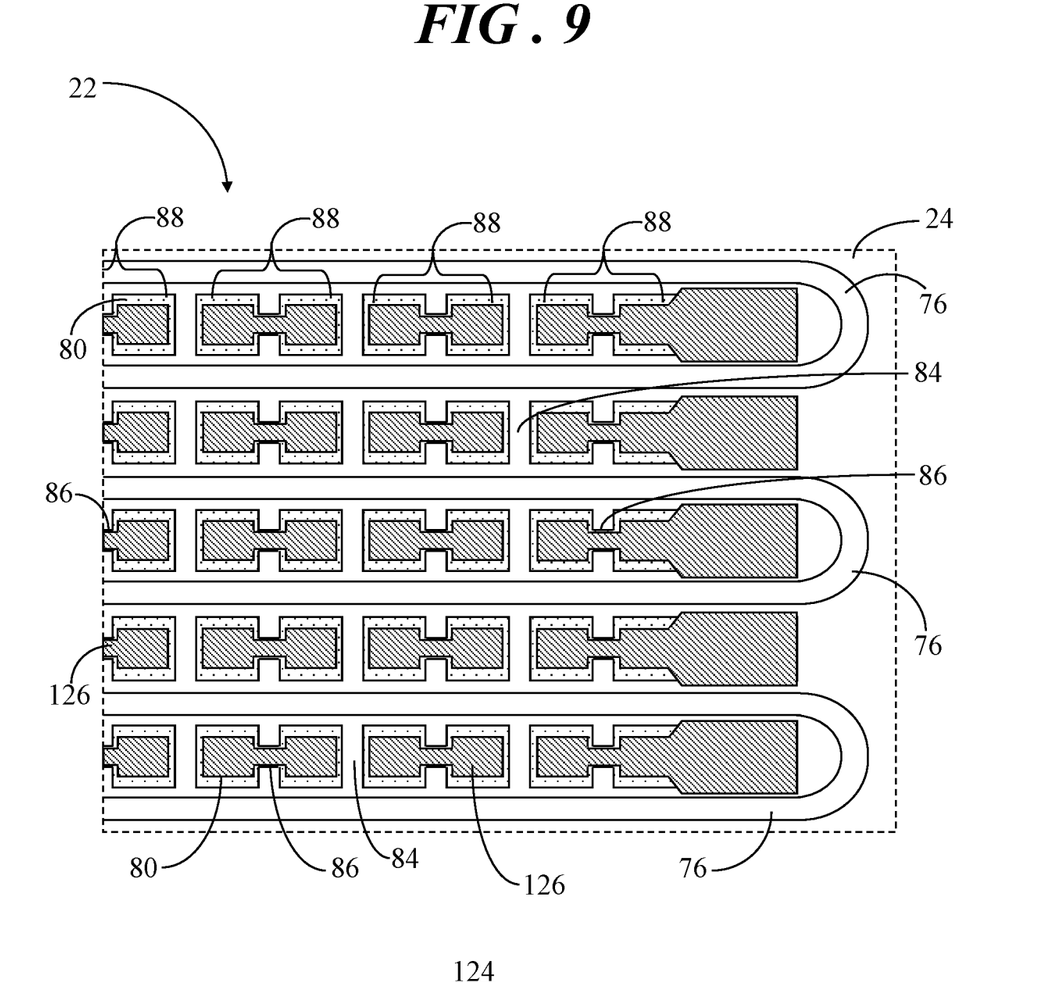
FIG. 9 shows an enlarged simplified plan view of a portion of the current sensing mirror device of the power MOSFET of FIG. 1 at an intermediate stage of processing.

Referring to FIG. 9 in connection with block 122 of method 112, FIG. 9 shows an enlarged simplified plan view of a portion of the current sensing mirror device of the power MOSFET of FIG. 1 at an intermediate stage 124 of processing. At intermediate stage 124, N+ blocks 126 are applied over second body implant regions 80 and over the link elements 86. Of course, for mainFET 26, N+ blocks 126 are additionally placed over first body implant regions 58 (not shown). N+ blocks 126 are placed over body implant regions 58, 80 and link elements 86 to protect those regions from a subsequent N+ source region implant process. That is, N+ blocks 126 will block the N+ type material from being implanted into the P+ body implant regions 58, 80 and into P+ link elements 86. N+ blocks 126 are linked as shown in FIG. 9. In alternative embodiments, N+ blocks 126 may be individual blocks or can be linked in other configurations than that shown.

Referring back to FIG. 8 and with continued reference to FIGS. 1-5, following block 122, process control continues with a block 128. At block 128, first source regions (56) and second source regions (78) of N+ type material are formed extending into the body region (48) from the upper surface (44) such that the sources regions (56) are interposed between the respective first and second gate trenches (50, 76) and the corresponding first and second body implant regions 58, 80. At a block 130, N+ blocks 126 (FIG. 9) are removed following formation of the first and second source region (56, 78)

At a block 132, source metal is provided to the first and second source regions (56, 78). More specifically, first source contacts (64) are provided over the upper surface (44) of the substrate (24) in electrical contact with the first source regions (56) and the first body implant regions (58). Likewise, second source contacts (82) are provided over the upper surface (44) of the substrate (24) in electrical contact with the second source regions (78) and the second body implant regions (80). At a block 134, a gate contact (66) is provided that is coupled to the conductive gate cores (52) of the first and second gate trenches (50, 76) and at a block 136, a drain contact (72) is provided that is coupled to the drain region 70 of the substrate 24. Following block 134, method 112 for fabricating power MOSFET 20 ends.

Accordingly, method 112 provides the operational blocks for forming mainFET 26 and mirror device 22 in the substrate 24, in which link elements 86 are formed between selected ones of pairs 88 of second body implant regions 80 of mirror device 22 and link elements are not formed between pairs of the first body implant regions 58 of mainFET 26. Further, the methodology enables producing the various linkage configurations and the various dimensions of link elements 86 and second body implant regions 80 in accordance with the embodiments described above.

It should be understood that certain ones of the process blocks depicted in FIG. 8 may be performed in parallel with each other or with performing other processes. In addition, the particular ordering of the process blocks depicted in FIG. 8 may be modified, while achieving substantially the same result. Accordingly, such modifications are intended to be included within the scope of the inventive subject matter.

Embodiments disclosed herein entail a power MOSFET having a current sensing mirror device and methodology for manufacturing a power MOSFET having an embedded current sensing mirror device. More particularly, a power MOSFET includes a mainFET and a current sensing FET, referred to herein as a mirror device. The mirror device implements an optimized layout that may effectively result in the threshold voltage of the mirror device more closely matching the threshold voltage of the mainFET in order to reduce or eliminate yield loss from fault current detection at the mirror device. An optimized layout for the mirror device can include link elements interconnecting pairs of the body implant regions. In some embodiments, the optimized layout may further entail widening the body implant regions of the mirror device so that the body implant regions are closer to the trench MOSFET channels. The optimized layout for the mirror device may be implemented in a power MOSFET without full mask revision to cost effectively achieve improvements in manufacturing yield.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A semiconductor device comprising:
   a substrate having an upper surface and a lower surface, the substrate including a body region of a first conductivity type;
   a main field effect transistor (mainFET) formed in the substrate, the mainFET including first gate trenches extending into the body region from the upper surface, first source regions of a second conductivity type adjacent to the first gate trenches, the second conductivity type differing from the first conductivity type, and first body implant regions of the first conductivity type extending into the body region adjacent to and interposed between the first source regions, wherein a doping concentration of the first body implant regions exceeds a background doping concentration of the body region; and a mirror device formed in the substrate, the mirror device including one or more second gate trenches extending into the body region from the upper surface, second source regions of the second conductivity type adjacent to the second gate trenches, second body implant regions of the first conductivity type extending into the body region adjacent to and interposed between the second source regions, wherein the doping concentration of the second body implant regions exceeds the background doping concentration of the body region, and link elements of the first conductivity type interconnecting pairs of the second body implant regions.

2. The semiconductor device of claim 1 wherein the mainFET does not include the link elements interconnecting pairs of the first body implant regions.

3. The semiconductor device of claim 1 wherein the link elements have same doping concentration as the second body implant regions.

4. The semiconductor device of claim 1 wherein the second body implant regions are spaced apart by a gap and the link elements span the gap to interconnect the pairs of the second body implant regions of the mirror device.

5. The semiconductor device of claim 1 wherein:
each of the second body implant regions is characterized by a body implant region width at the upper surface of the substrate; and
each of the link elements is characterized by a link element width at the upper surface of the substrate, the body implant region width and the link element width being oriented perpendicular to a longitudinal dimension of the second gate trenches, and the link element width being less than the body implant region width.

6. The semiconductor device of claim 5 wherein the link element width is in a range of 40-60% less than the body implant region width.

7. The semiconductor device of claim 1 wherein each of the second body implant regions that is interconnected by one of the link elements to another of the second body implant regions is not interconnected to an adjacent one of the second body implant regions.

8. The semiconductor device of claim 1 wherein the link elements interconnect every other one of the pairs of the second body implant regions.

9. The semiconductor device of claim 1 wherein every pair of the second body implant regions is interconnected by a distinct one of the link elements.

10. The semiconductor device of claim 1 wherein:
each of the first body implant regions of the mainFET is characterized by a first body implant region width at the upper surface of the substrate, the first body implant region width being oriented perpendicular to a longitudinal dimension of the first gate trenches; and
each of the second body implant regions of the mirror device is characterized by a second body implant region width at the upper surface of the substrate, the second body implant region width being oriented perpendicular to a longitudinal dimension of the second gate trenches, and the second body implant region width being greater than the first body implant region width.

11. The semiconductor device of claim 9 wherein the second body implant region width is in a range of 10-30% greater than the first body implant region width.

12. A semiconductor device comprising:
a substrate having an upper surface and a lower surface, the substrate including a body region of a first conductivity type;
a main field effect transistor (mainFET) formed in the substrate, the mainFET including first gate trenches extending into the body region from the upper surface, first source regions of a second conductivity type adjacent to the first gate trenches, the second conductivity type differing from the first conductivity type, and first body implant regions of the first conductivity type extending into the body region adjacent to and interposed between the first source regions, wherein a doping concentration of the first body implant regions exceeds a background doping concentration of the body region; and
a mirror device formed in the substrate, the mirror device including one or more second gate trenches extending into the body region from the upper surface, second source regions of the second conductivity type adjacent to the second gate trenches, second body implant regions of the first conductivity type extending into the body region adjacent to and interposed between the second source regions, wherein the doping concentration of the second body implant regions exceeds the background doping concentration of the body region, and link elements of the first conductivity type interconnecting pairs of the second body implant regions, the link elements have same doping concentration as the second body implant regions, wherein the mainFET does not include the link elements interconnecting pairs of the first body implant regions.

13. The semiconductor device of claim 12 wherein:
each of the second body implant regions is characterized by a body implant region width at the upper surface of the substrate; and
each of the link elements is characterized by a link element width at the upper surface of the substrate, the body implant region width and the link element width being oriented perpendicular to a longitudinal dimension of the second gate trenches, and the link element width being less than the body implant region width.

14. The semiconductor device of claim 12 wherein each of the second body implant regions that is interconnected by one of the link elements to another of the second body implant regions is not interconnected to an adjacent one of the second body implant regions.

15. The semiconductor device of claim 12 wherein:
each of the first body implant regions of the mainFET is characterized by a first body implant region width at the upper surface of the substrate, the first body implant region width being oriented perpendicular to a longitudinal dimension of the first gate trenches; and
each of the second body implant regions of the mirror device is characterized by a second body implant region width at the upper surface of the substrate, the second body implant region width being oriented perpendicular to a longitudinal dimension of the second gate trenches, and the second body implant region width being greater than the first body implant region width.

* * * * *